(12) United States Patent
Schultz

(10) Patent No.: US 11,862,640 B2
(45) Date of Patent: Jan. 2, 2024

(54) CROSS FIELD EFFECT TRANSISTOR (XFET) LIBRARY ARCHITECTURE POWER ROUTING

(71) Applicant: Advanced Micro Devices, Inc., Santa Clara, CA (US)

(72) Inventor: Richard T. Schultz, Ft. Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/489,276

(22) Filed: Sep. 29, 2021

(65) Prior Publication Data

US 2023/0096652 A1    Mar. 30, 2023

(51) Int. Cl.
  *H01L 27/12* (2006.01)
  *H01L 23/48* (2006.01)
  *H01L 21/84* (2006.01)
  *H01L 23/528* (2006.01)

(52) U.S. Cl.
  CPC .......... *H01L 27/1203* (2013.01); *H01L 21/84* (2013.01); *H01L 23/481* (2013.01); *H01L 23/5286* (2013.01)

(58) Field of Classification Search
  CPC ... H01L 27/1203; H01L 21/84; H01L 23/481; H01L 23/5286; H01L 27/1104; H01L 23/528; G11C 11/412
  USPC ............................................. 257/66; 438/149
  See application file for complete search history.

(56) References Cited

U.S. PATENT DOCUMENTS

| 6,156,600 A | 12/2000 | Chao et al. |
|---|---|---|
| 7,723,806 B2 | 5/2010 | Liaw |
| 8,063,450 B2 | 11/2011 | Wernersson et al. |
| 8,561,003 B2 | 10/2013 | Kawa et al. |

(Continued)

FOREIGN PATENT DOCUMENTS

| EP | 3979305 A1 | 4/2022 |
|---|---|---|
| JP | S6035564 A | 2/1985 |

(Continued)

OTHER PUBLICATIONS

International Search Report and Written Opinion in International Application No. PCT/US2022/076562, dated Dec. 19, 2022, 16 pages.

(Continued)

*Primary Examiner* — Thinh T Nguyen
(74) *Attorney, Agent, or Firm* — KOWERT HOOD MUNYON RANKIN AND GOETZEL PC; Rory D. Rankin

(57) ABSTRACT

A system and method for efficiently creating layout for memory bit cells are described. In various implementations, cells of a library use Cross field effect transistors (FETs) that include vertically stacked gate all around (GAA) transistors with conducting channels oriented in an orthogonal direction between them. The channels of the vertically stacked transistors use opposite doping polarities. One or more of these cells use a dual polarity local interconnect power connection to receive a voltage reference level from a backside bus. For example, a power supply reference voltage level is received by a p-type device from a backside bus where the connection traverses both a p-type local interconnect layer and an n-type local interconnect layer.

7 Claims, 19 Drawing Sheets

(56) References Cited

U.S. PATENT DOCUMENTS

| | | |
|---|---|---|
| 9,425,318 B1 | 8/2016 | Hoentschel et al. |
| 9,704,995 B1 | 7/2017 | Schultz |
| 10,068,794 B2 | 9/2018 | Schultz |
| 10,186,510 B2 | 1/2019 | Schultz |
| 10,304,728 B2 | 5/2019 | Schultz |
| 10,608,076 B2 | 3/2020 | Schultz |
| 11,120,190 B2 | 9/2021 | Schultz |
| 11,189,569 B2 | 11/2021 | Schultz et al. |
| 2001/0041402 A1 | 11/2001 | Yamamoto |
| 2006/0216897 A1 | 9/2006 | Lee et al. |
| 2007/0157144 A1 | 7/2007 | Mai et al. |
| 2007/0170471 A1 | 7/2007 | Joly et al. |
| 2007/0278528 A1 | 12/2007 | Ato et al. |
| 2009/0187871 A1 | 7/2009 | Cork |
| 2010/0148219 A1 | 6/2010 | Shimizu |
| 2011/0151668 A1 | 6/2011 | Tang et al. |
| 2012/0007051 A1 | 1/2012 | Bangsaruntip et al. |
| 2012/0138886 A1 | 6/2012 | Kuhn et al. |
| 2013/0155753 A1 | 6/2013 | Moon et al. |
| 2013/0161792 A1 | 6/2013 | Tran et al. |
| 2014/0106474 A1 | 4/2014 | Chen et al. |
| 2014/0145342 A1 | 5/2014 | Schultz et al. |
| 2014/0183643 A1 | 7/2014 | Colinge et al. |
| 2014/0374879 A1 | 12/2014 | Chen et al. |
| 2015/0061087 A1 | 3/2015 | Hong |
| 2015/0144880 A1 | 5/2015 | Rachmady et al. |
| 2015/0243519 A1 | 8/2015 | deVilliers |
| 2015/0295036 A1 | 10/2015 | Hong |
| 2015/0370951 A1 | 12/2015 | Kawa et al. |
| 2015/0372104 A1 | 12/2015 | Liu et al. |
| 2019/0304974 A1 | 10/2019 | Sharma et al. |
| 2020/0035560 A1 | 1/2020 | Block et al. |
| 2021/0074350 A1* | 3/2021 | Vincent et al. ..... H01L 27/1104 |
| 2021/0376137 A1 | 12/2021 | Yang et al. |

FOREIGN PATENT DOCUMENTS

| | | |
|---|---|---|
| WO | 2014051769 A1 | 4/2014 |
| WO | 2015199644 A1 | 12/2015 |

OTHER PUBLICATIONS

International Search Report and Written Opinion in International Application No. PCT/US2017/052339, dated Dec. 6, 2017, 15 pages.

Dargis et al., "Epitaxial Growth and Properties of Silicon on Crystalline Rare-Earth-Metal Oxide for SOI-Applications", Materials Science, May 1, 2009, pp. 11-15, vol. 15, No. 1.

Schultz, Richard T., U.S. Appl. No. 17/489,221, entitled "Cross Field Effect Transistor (XFET) Architecture Process", filed Sep. 29, 2021, 37 pages.

* cited by examiner

__US 11,862,640 B2__

CROSS FIELD EFFECT TRANSISTOR (XFET) LIBRARY ARCHITECTURE POWER ROUTING

BACKGROUND

Description of the Relevant Art

As both semiconductor manufacturing processes advance and on-die geometric dimensions reduce, semiconductor chips provide more functionality and performance while consuming less space. While many advances have been made, design issues still arise with modern techniques in processing and integrated circuit design that limit potential benefits. For example, capacitive coupling, electro migration, short channel effects such as at least leakage currents, and processing yield are some issues which affect the placement of devices and the routing of signals across an entire die of a semiconductor chip. These issues have the potential to delay completion of the design and affect the time to market.

In order to shorten the design cycle for semiconductor chips, manual full-custom designs are replaced with automation where possible. In some cases, a standard cell layout is created manually. In other cases, the rules used by the place-and-route tool are adjusted to automate the cell creation. However, the automated process at times does not satisfy each of the rules directed at performance, power consumption, signal integrity, process yield, both local and external signal routing including internal cross coupled connections, pin access, power and ground connections, and so on. Therefore, designers manually create these cells to achieve better results for the multiple characteristics or rewrite the rules for the place-and-route tool. However, many times, the layout tools and rules still don't achieve the performance necessary for the resulting circuits without consuming an appreciable amount of power and consuming a significant amount of on-die area.

In view of the above, efficient methods and systems for creating layout for standard cells are desired.

Figure 1:
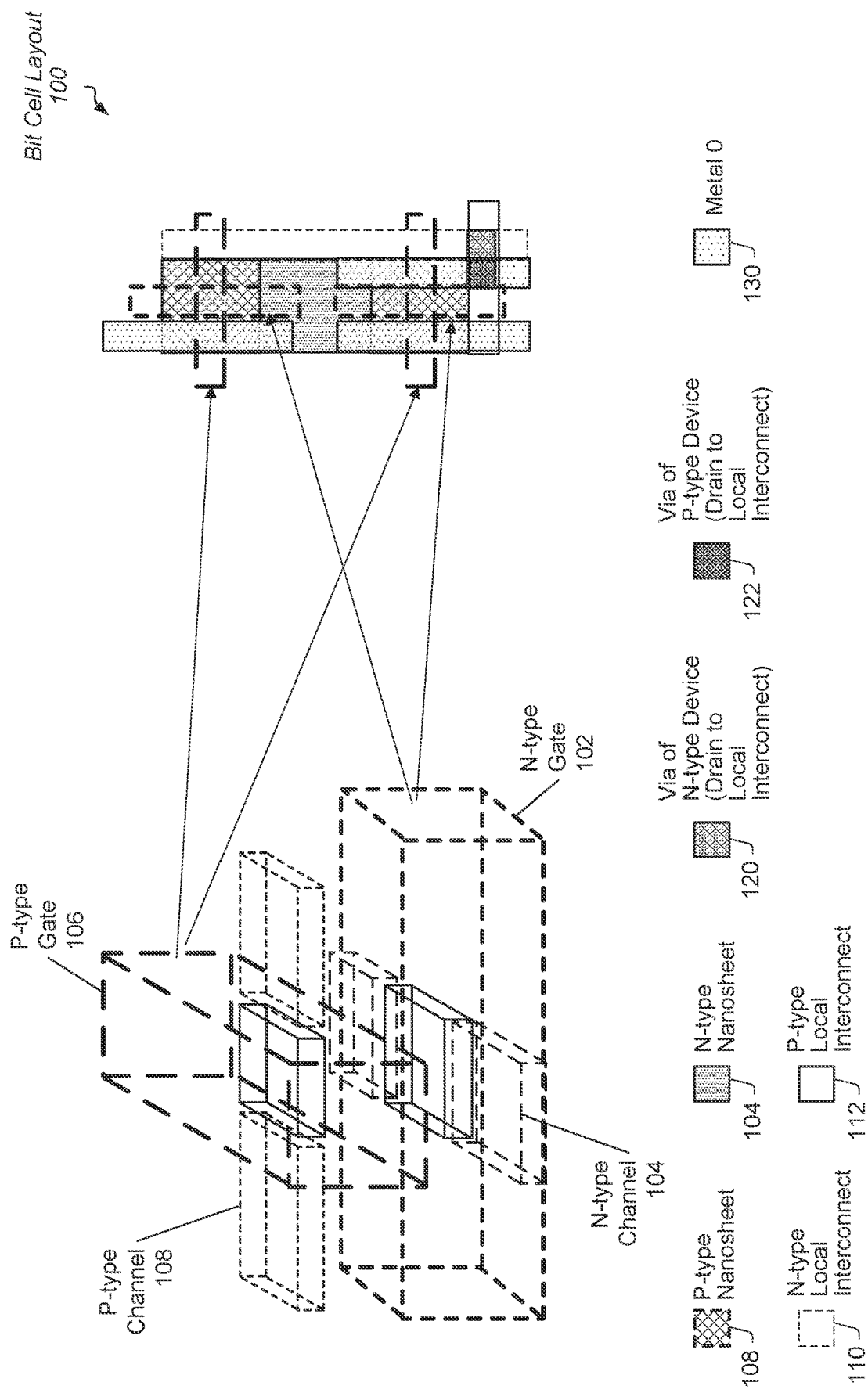
FIG. 1 is a generalized diagram of a top view of standard cell layout utilizing Cross field effect transistors (FETs).

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for efficiently creating layout for memory bit cells are contemplated. In various implementations, one or more standard cells include cross field effect transistors (FETs). As used herein, "Cross FETs" are also referred to as a "XFETs." Additionally, as used herein, a "transistor" is also referred to as a "semiconductor device" or a "device." In some implementations, the Cross FETs are vertically stacked gate all around (GAA) transistors such as a top vertical GAA transistor (or GAA transistor) is formed vertically on top of a bottom GAA transistor with at least an isolating oxide layer in between the two GAA transistors. In addition, the top GAA transistor has one or more conducting channels positioned orthogonal to the one or more conducting channels of the bottom GAA transistor. Therefore, the direction of current flow of the top GAA transistor through one or more top channels is orthogonal to the direction of current flow of the one or more bottom channels of the bottom GAA transistor.

The top GAA transistor has a doping polarity of one or more top channels that is an opposite polarity of the doping polarity of one or more bottom channels of the bottom GAA transistor. For example, in an implementation, the top GAA transistor includes one or more p-type channels, whereas, the bottom GAA transistor includes one or more n-type channels. In another implementation, the p-type and n-type polarities are reversed between the one or more channels of the top GAA transistor and the bottom GAA transistor. With the orthogonal orientation between the top GAA transistor and the bottom GAA transistor, both the top and bottom GAA transistors have the maximum mobility for their respective carriers based on their orientation.

An integrated circuit includes at least one integrated circuit that utilizes Cross FETs for implementing standard cells. One or more of these cells use a dual polarity local interconnect power connection to receive a voltage reference level from a backside bus. For example, a power supply reference voltage level is received by a p-type device from a backside bus where the connection traverses both a p-type local interconnect layer and an n-type local interconnect layer.

Turning now to FIG. 1, a generalized block diagram of a top view of a standard cell layout 100 is shown that uses Cross FETs. The standard cell layout 100 is for an inverter using Cross FETs. However, in other implementations, the characteristics and techniques used for standard cell layout 100 is used for a variety of other types of Boolean gates and complex gates. A three-dimensional (3-D) illustration of the p-type and n-type Cross FETs accompanies the layout 100. As shown, a p-type device is vertically stacked on an n-type device. The n-type device includes at least an n-type gate 102 formed all around an n-type channel 104. Similarly, a p-type gate 106 is formed all around a p-type channel 108. Therefore, the p-type channel 108 has a doping polarity that is an opposite polarity of the n-type channel 104 of the bottom n-type device. Although a single n-type channel 104 and a single p-type channel 108 is shown, in other implementations, the semiconductor devices include another number of channels. In some implementations, the channel is a lateral nanowire. In other implementations, the channel is a nanosheet.

The n-type channel 104 and the n-type gate 102 are oriented in an orthogonal direction to the p-type channel 108 and the p-type gate 106. In other words, the n-type channel 104 and the n-type gate 102 are oriented in a direction that is 90 degrees from a direction of the p-type channel 108 and the p-type gate 106. Therefore, the direction of current flow of the bottom n-type device through the n-type channel 104 is orthogonal to the direction of current flow of the p-type channel 108 of the top p-type device. With the orthogonal orientation between the top p-type device and the bottom n-type device, both devices have the maximum mobility for their respective carriers based on their orientation. In addition, the orthogonal orientation of the top p-type device and the bottom n-type device allow connections between the vertically stacked devices to use a single via layer.

In the standard cell layout 100, the metal zero layer (M0 or Metal0) 130 is the top-most layer. A gate contact would be a next vertically highest layer, but the gate contacts are not shown for ease of illustration. The p-type gate 106 is the next vertically highest layer followed by the p-type nanosheet 108, which creates the p-type channel. Insulating layers are between the top p-type device and the bottom n-type device with a gate contact formed between the devices in the insulating layers. This gate contact is not shown with the aerial top view provided by the standard cell layout 100 (or layout 100). Cross-section views of standard cell layout are provided later. The gate contact between the vertically stacked devices is directly connected to the p-type metal gate 106 and the n-type metal gate 102 without traversing any metal layers.

The via (or contact) 122 of the p-type device connects the drain region of the p-type device to local interconnect 112 of the p-type device. The via (or contact) 120 of the n-type device connects the drain region of the n-type device to local interconnect 110 of the n-type device. The vertically stacked devices of the layout 100 consumes less on-die area. The use of a single via layer reduces resistance and capacitance of the circuit. Compared to Fin FETs, the use of gate all around (GAA) nanowires or nanosheets provides lower threshold voltages, faster switching times, less leakage currents, and further reduction of short channel effects. Examples of short channel effects other than leakage current are latchup effects, drain-induced barrier lowering (DIBL), punchthrough, performance dependency on temperature, impact ionization, and parasitic capacitance to the silicon substrate and to the wells used for the source and drain regions.

One advantage of the orthogonal orientation of the Cross FETs in the layout 100 includes a single via layer. In contrast, Complementary FETs (CFETs) use multiple metal layers and multiple via layers to make connections between vertically stacked devices. Gaining access to the source and drain regions of the bottom device of Cross FETs is easier than compared with CFETs. Another advantage of the orthogonal orientation of the Cross FETs in the layout 100 is use of the maximum mobility of each of the carriers in each device of the vertically stacked devices.

Figure 2:
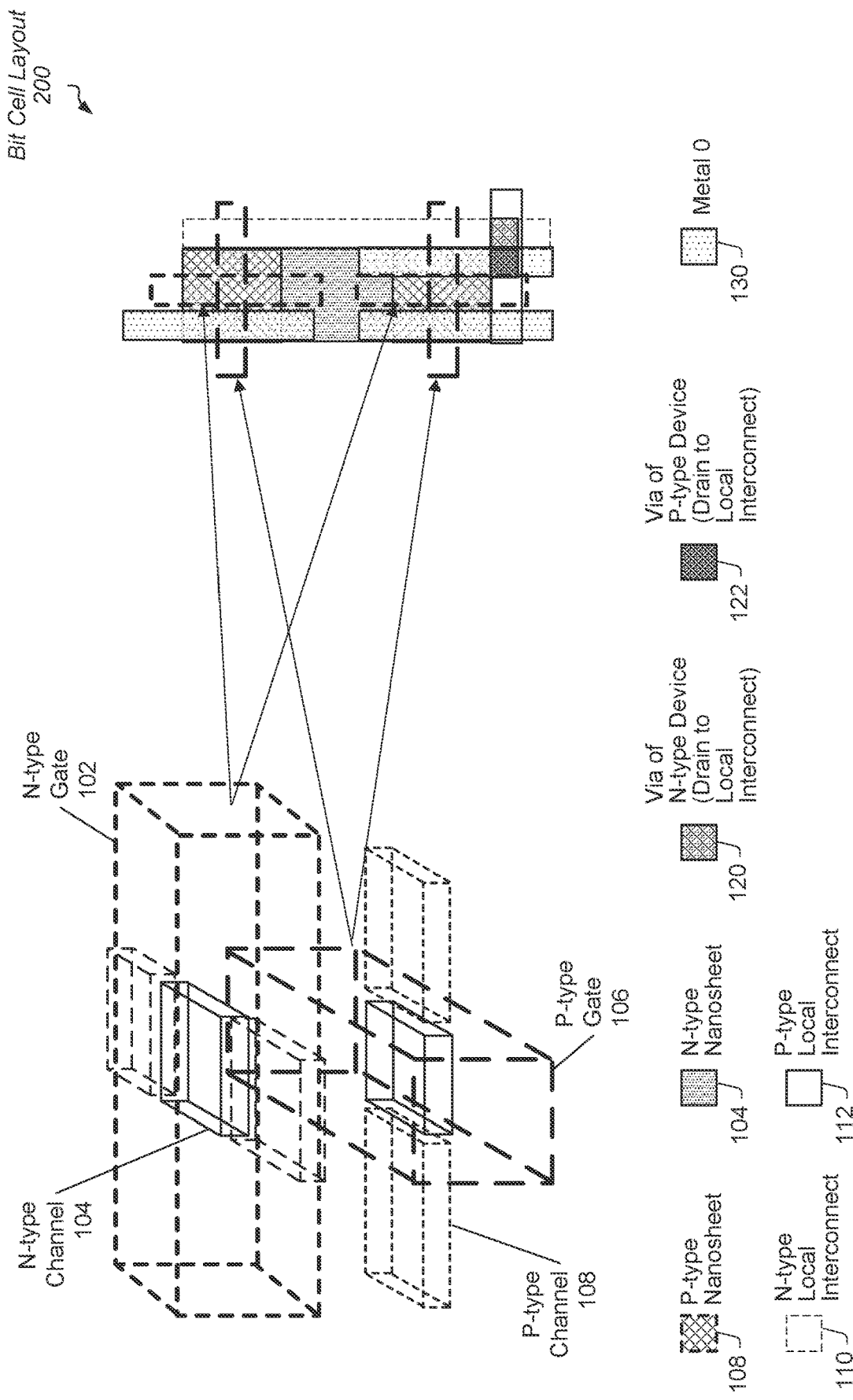
FIG. 2 is a generalized diagram of a top view of standard cell layout utilizing Cross FETs.

Turning now to FIG. 2, a generalized block diagram of a top view of a standard cell layout 200 is shown. The standard cell layout 200 is for a 2-input Boolean NAND gate using Cross FETs. A three-dimensional (3-D) illustration of the p-type and n-type Cross FETs accompanies the layout 200. Contacts (or vias), materials and structures described earlier are numbered identically. As shown, an n-type device is vertically stacked on a p-type device. Similar to the layout 100, in other implementations, the Cross FETs of the layout 200 use multiple n-type channels 104 and multiple p-type channels 108. Similar to the layout 100, the layout 200 uses an orthogonal orientation between the n-type channel 104 and the p-type channel 108, and uses a single via layer to create connections between the vertically stacked devices.

In contrast to Fin field effect transistors (Fin FETs), where a Fin of doped silicon has physical contact with the silicon substrate, the channels of vertical GAA devices do not have physical contact with the silicon substrate. Generally, when compared to Fin FETs, GAA transistors provide lower threshold voltages, faster switching times, less leakage currents, and further reduction of short channel effects. In some implementations, a channel of doped silicon of the GAA transistor is a nanowire. In other implementations, a channel of doped silicon of the GAA transistor is a nanosheet. A nanosheet is a sheet of doped silicon, rather than a wire of doped silicon. In other words, the nanosheet is a wider and thicker conductive wire than a lateral nanowire. The nanosheet can also be considered as a Fin that is rotated and placed on its side vertically above the silicon substrate such that the nanosheet does not have physical contact with the silicon substrate. Rather, metal gate is formed between the nanosheet and the silicon substrate. This visualization, though, does not describe the actual fabrication steps for forming the nanosheet.

Vertically stacking a top GAA transistor on top of a bottom GAA transistor further increases performance, reduces power consumption, reduces on-die area consumed by the GAA transistors, and further reduces short channel effects. Complementary FETs (CFETs) include a top GAA transistor vertically stacked on top of a bottom GAA transistor with at least an oxide layer in between for isolation. However, CFETs uses a top GAA transistor with one or more channels aligned in a same direction as the one or more channels of the bottom GAA transistor. As shown earlier, Cross FETs, though, have an orthogonal orientation between the one or more channels of the top GAA transistor and the one or more channels of the bottom GAA transistor. Compared to Complementary FETs, Cross FETs have better mobility for each of the top GAA transistor and the bottom GAA transistor, which leads to higher performance. Complementary FETs use two metal layers and three via layers to create connections between the top GAA transistor and the bottom GAA transistor. In contrast, Cross FETs utilize a single metal layer and a single via layer for connections between the top and bottom GAA transistors. Cross FETs have the bottom GAA transistor formed in a first wafer while the top GAA transistor is formed in a second wafer using conventional semiconductor fabrication steps. The first wafer and the second wafer are connected to one another through a hybrid bond process, which increases yield.

Figure 3:
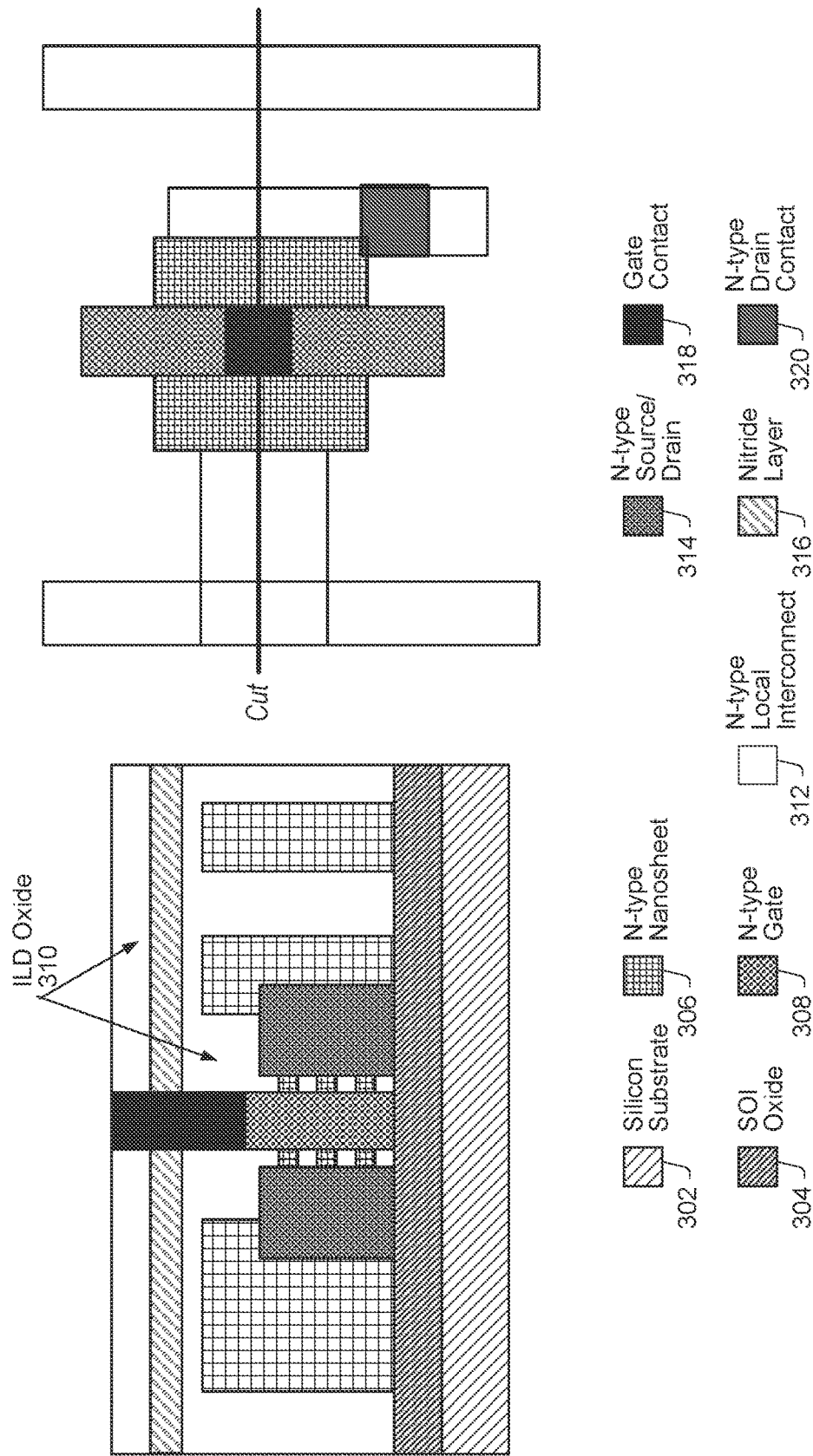
FIG. 3 is a generalized diagram of a top view of standard cell layout utilizing Cross FETs.
Figure 4:
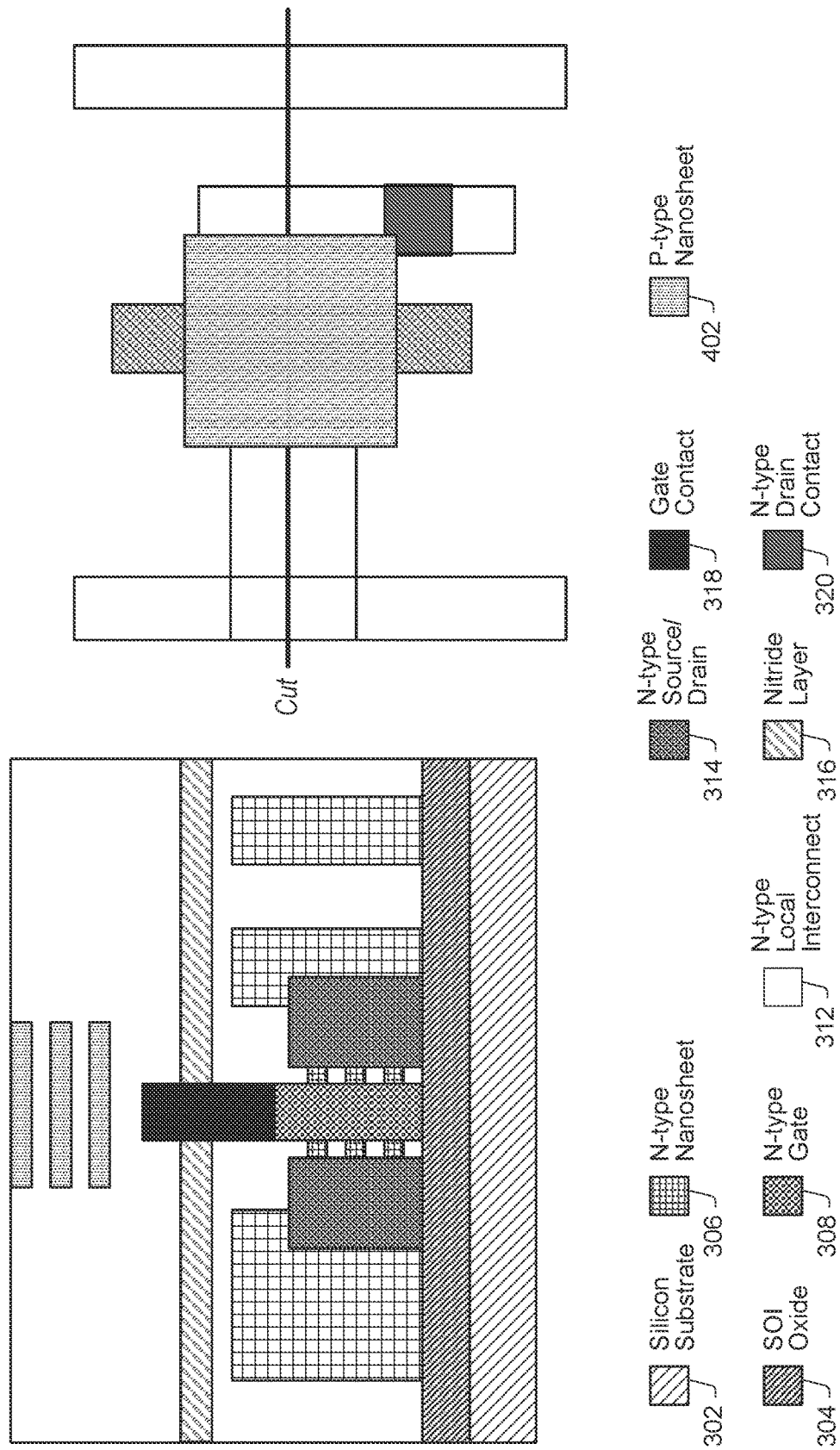
FIG. 4 is a generalized diagram of a top view of standard cell layout utilizing Cross FETs.
Figure 5:
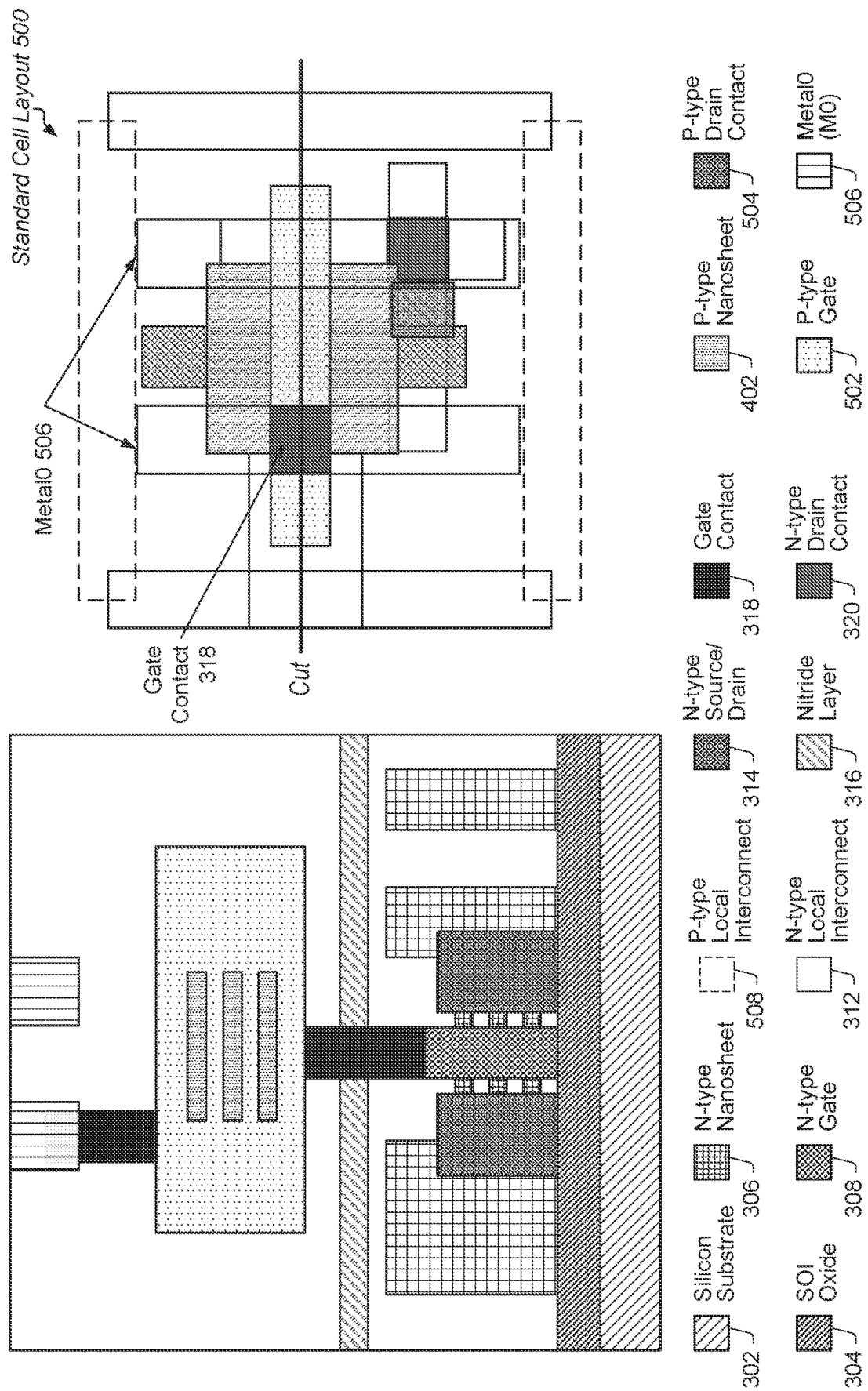
FIG. 5 is a generalized diagram of a top view of standard cell layout utilizing Cross FETs.
Figure 6:
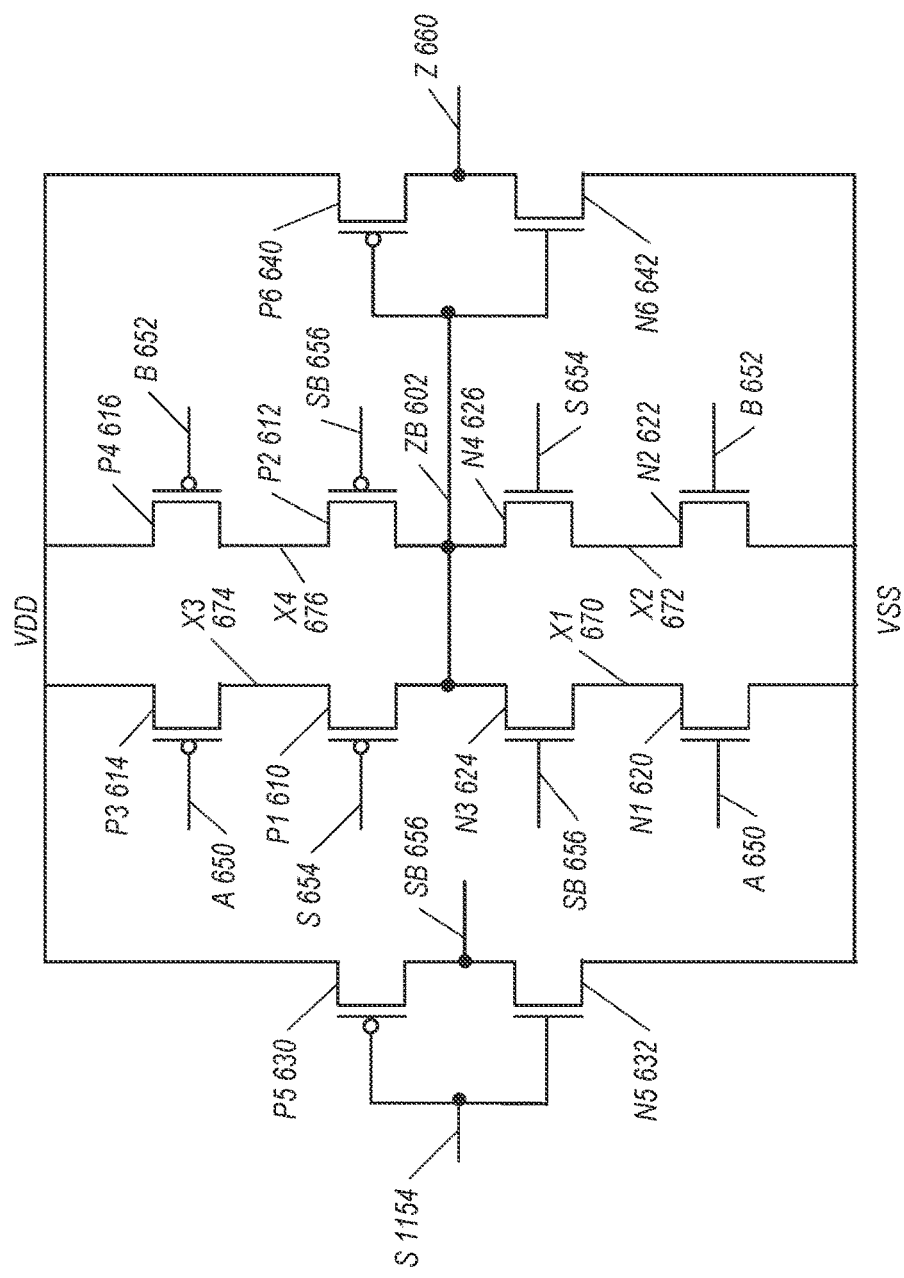
FIG. 6 is a generalized diagram of a schematic of a multiplexer gate.

In the following description, layout techniques for forming an inverter are shown in FIGS. 3-5. These techniques are also used for forming a six transistor (6T) random access data storage of a memory bit cell that consumes a planar area above a silicon substrate of four transistors. This memory bit cell that uses Cross FETs is used in a memory bank as shown in FIG. 6. The layout techniques for forming the 6T random access data storage of the memory bit cell are shown in FIGS. 7-15.

Turning now to FIG. 3, a generalized block diagram of a top view of a standard cell layout 300 is shown. The top view of the layout 300 is shown on the right, and the cross-sectional view is shown on the left. For this inverter, a p-type device is being vertically stacked on an n-type device. However, in other implementations, it is possible and contemplated to have an n-type device vertically stacked on a p-type device. Each of the devices of the inverter uses gate all around (GAA) metal that wraps around one or more nanosheets in the gate region in a 360-degree manner. The bottom n-type device is fabricated on a first wafer. The top p-type device is fabricated on a separate second wafer, which is then bonded to the first wafer as described later.

Here, in layout 300, a silicon on insulator (SOI) oxide layer 304 is deposited on the silicon substrate 302. In various implementations, the SOI oxide layer 304 is a silicon dioxide ($SiO_2$) layer. The semiconductor device fabrication process is building a local silicon on insulator (SOI) which insulates the body of the device from the silicon substrate 302. In an implementation, the formed SOI oxide layer 304 is relatively thick. A stack of channels is formed over the SOI oxide layer 304. In an implementation, the stack of channels are n-type nanosheets 306. Gate metal material 308 is deposited followed by CMP steps to polish the gate metal 308. In various implementations, titanium nitride (TiN) is used for the gate metal 308. The gate metal 308 is provided all around the n-type nanosheets 306 in a 360-degree manner. An interlayer dielectric (ILD) oxide layer 310 is deposited around the gate region.

The n-type source and drain regions 314 are formed. In an implementation, the n-type source and drain regions 314 are epitaxially grown silicon doped with Phosphorous. Afterward, the n-type local interconnect 312 is formed. In some implementations, n-type local interconnect 312 includes the tungsten, cobalt, ruthenium, or molybdenum. A silicon nitride layer 316 and additional ILD oxide 310 are formed on the initial ILD oxide 310 layer. For example, a silicon nitride (SiNx) layer 316 is deposited on the ILD oxide 310 layer. The chemical and electrical properties of amorphous hydrogenated silicon nitride (SiNx) make this material a good candidate for an insulating layer in integrated circuits. Each of the nitride layer 316 and the ILD oxide 310 layer are etched to create space for the gate contact 318. Similarly, the nitride layer 316 and the ILD oxide 310 layer are etched to create space for the drain contact 320. The gate contact 318 and the drain contract 320 are deposited in the created spaces.

Referring to FIG. 4, a generalized block diagram of a top view of a standard cell layout 400 is shown. Contacts (or vias), materials and other layout elements described earlier are numbered identically. The standard cell layout 400 (or layout 400) on the right is a continuation of the semiconductor processing steps being performed on the layout 300 for an inverter using Cross FETs. A cross-sectional view of the semiconductor layers used in the layout 400 also accompanies the layout 400 and it is shown on the left. A stack of channels is formed over the n-type gate contact 318 in the ILD oxide layer 310. In an implementation, the stack of channels are p-type nanosheets 402. In some implementations, a separate wafer has alternating layers grown such as a silicon germanium semiconducting epitaxial growth layer alternating with a silicon semiconducting epitaxial growth layer. The separate wafer with the alternating layers is bonded to the top of ILD oxide layer 310 of the layout 300 (of FIG. 3). In other implementations, the alternating layers are grown on top of ILD oxide layer 310 of the layout 300 followed by one of the earlier named processes for etching the layers to the size of the p-type nanosheets 402. The earlier named processes were described in relation to forming the n-type nanosheets 306.

Turning now to FIG. 5, a generalized block diagram of a top view of a standard cell layout 500 is shown. Contacts (or vias), materials and other layout elements described earlier are numbered identically. The standard cell layout 500 (or layout 500) on the right is a continuation of the semiconductor processing steps being performed on the layout 400 for creating an inverter using Cross FETs. A cross-sectional view of the semiconductor layers used in the layout 500 also accompanies the layout 500 and it is shown on the left. The ILD oxide 310 layer is etched to create space for the p-type gate 502, which is placed all around the p-type nanosheets 402. Similarly, the ILD oxide 310 layer is etched to create space for the drain contact 504. The gate contact 318 and the drain contract 504 are deposited in the created spaces. Here, a metal zero layer (or metal0 or Metal 0 or M0) 506 is deposited for creating further connections for the inverter. It is noted that the metal zero layer 506 is also referred to by different names in order to maintain a convention of using the metal zero layer as a horizontal layer such as in the next layer up.

Referring to FIG. 6, a generalized block diagram of one implementation of a multiplexer gate 600 is shown. In the implementation shown, the multiplexer gate 600 (or mux gate 600) receives three input signals indicated as A 650, B 652 and S 654, and generates an output signal indicated as Z 660. The mux gate 600 uses P5 630 and N5 632 as an inverter that generates the signal SB 656 from the received signal S 654. The mux gate 600 uses the devices P5 630 and N5 632 as an inverter that generates the signal SB 656 from the received signal S 654. The mux gate 600 uses the devices P6 640 and N6 642 as an inverter that generates the signal Z 660 from the received signal ZB 602.

The devices P3 614 and N1 620 receive the input signal A 650, the devices P4 616 and N2 622 receive the input signal B 652, and the devices P1 610 and N4 626 receive the input signal S 654. Additionally, the devices P2 612 and N3 624 receive the internally generated signal SB 656. The devices 610-626 are connected in a configuration that provides the functionality of a multiplexer. For example, when the select input signal S 654 is asserted, the mux gate 600 generates a logic level on the output signal Z 660 equivalent to the current logic level of the input signal A 650. When the select input signal S 654 is negated, the mux gate 600 generates a logic level on the output signal Z 660 equivalent to the current logic level of the input signal B 652.

The mux gate 600 is an example of a transistor schematic of a type of cell that uses Cross FETs where devices of a vertical stack receive different input signals. For example, a semiconductor fabricated circuit of the mux gate 600 includes the p-type device P1 610 and the n-type device N1 620 in a same vertical stack. As shown, the p-type device P1 610 receives the signal S 654, whereas, the n-type device N1 620 receives a different signal such as the signal A 650. Similarly, a vertical stack that includes the pair of devices P2 612 and N2 622 receives different input signals.

Likewise, each of a vertical stack that includes the pair of devices P3 614 and N3 624 receive different signals, and a vertical stack that includes P4 616 and N4 626 receive different signals. Such a cell with at least one vertical stack with devices that receive different input signals has at least one extended gate region to complete the internal connections of the fabricated circuit. Therefore, the height dimension of the cell increases to being greater than a height of cells that includes vertical stacks where the corresponding devices receive a same input signal. As an example, the fabricated cell of the mux gate 600 has a height greater than a height of a fabricate cell of the logic gate 600.

Figure 7:
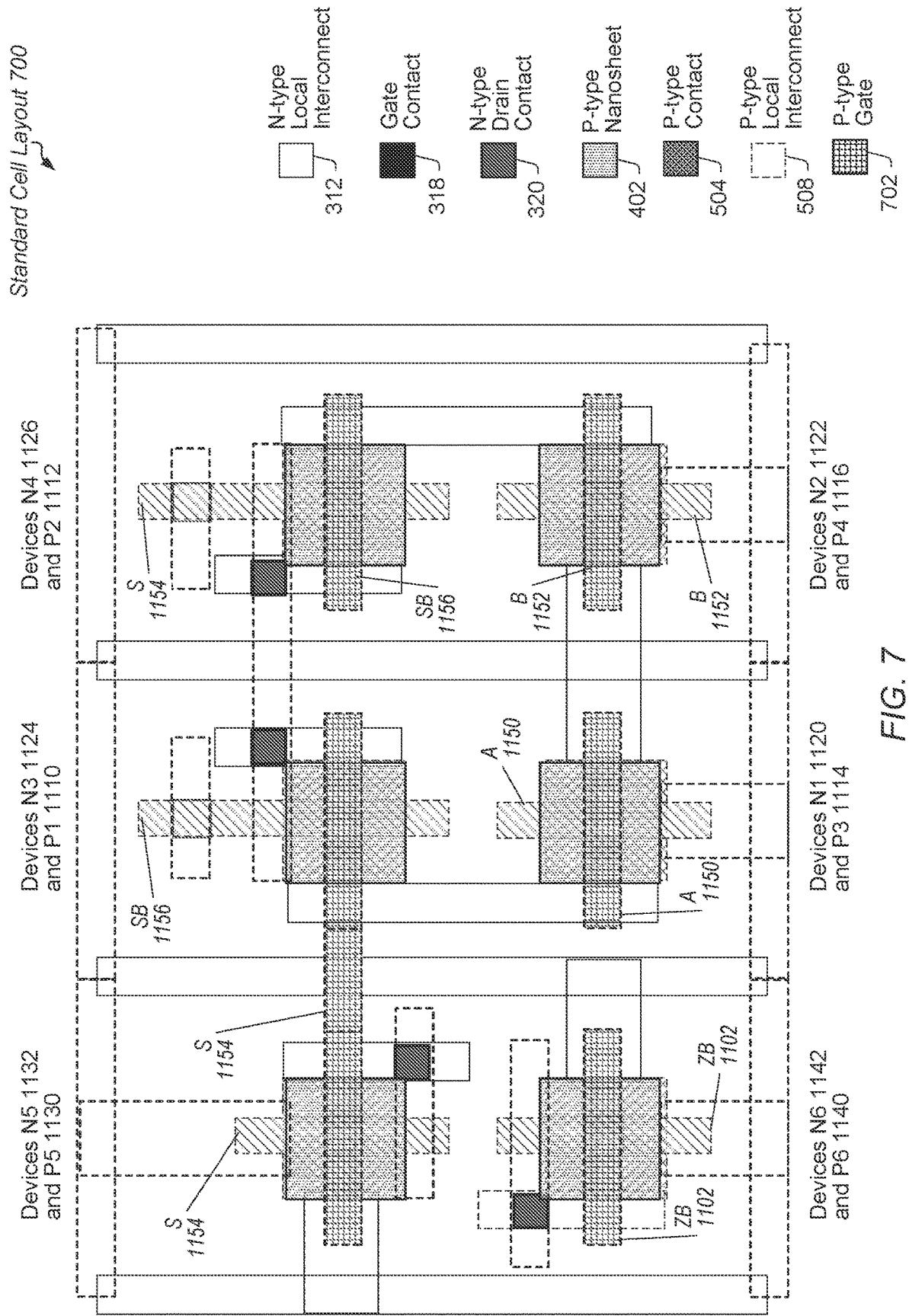
FIG. 7 is a generalized diagram of a top view of layout of a multiplexer gate utilizing Cross FETs.
Figure 8:
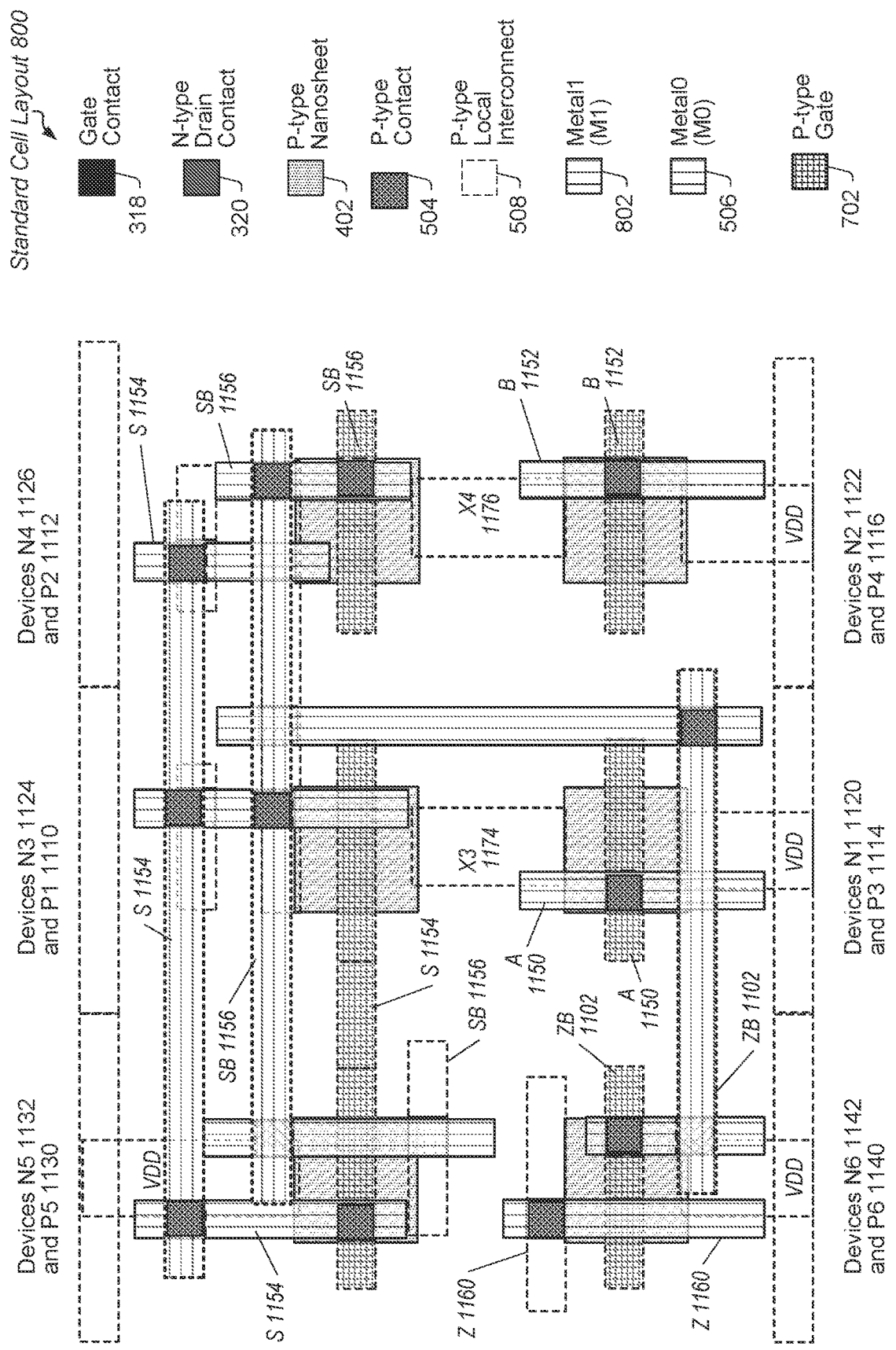
FIG. 8 is a generalized diagram of a top view of layout of a multiplexer gate utilizing Cross FETs.

In the following description, the layout 700 (of FIG. 7) provides techniques for forming layout of the n-type devices of the mux gate 600 (of FIG. 6), whereas, the layout 800 (of FIG. 8) provides techniques for forming layout of the p-type devices of the mux gate 600. Contacts (or vias), materials, and other layout elements described earlier are numbered identically in FIGS. 7-8. Turning now to FIG. 7, a generalized block diagram of a top view of layout 700 of the mux gate 600 is shown. For this layout, a p-type device is being vertically stacked on an n-type device. However, in other implementations, it is possible and contemplated to have an n-type device vertically stacked on a p-type device.

Here, in layout 700 of FIG. 7, a stack of n-type nanosheets, the metal gate, the n-type local interconnect 312, and the drain contact 320 are formed for the layout of the mux gate 600 (of FIG. 6) in a similar manner as described earlier for an inverter. The signal names and the device names used in the mux gate 600 are shown here to aid the description of the forming of the layout. The n-type local interconnect 312 is used to provide the node X1 670 between the n-type transistors N3 624 and N1 620, and to provide the node X2 672 between the n-type transistors N4 626 and N2 622. The p-type nanosheets 402 are formed, the p-type gate metal material 702 is deposited, and the p-type local interconnect 508 is formed as described earlier. The p-type local interconnect 508 is used to provide the node X3 674 between the p-type transistors P4 616 and P1 610, and to provide the node X4 676 between the p-type transistors P3 614 and P2 612. In the layout 800 of FIG. 8, a metal zero layer (M0) 506 and a metal layer 802 between the p-type local interconnect 508 and the M0 506 is deposited for creating further connections for the layout of the mux gate 600. The layout is later fabricated, and the mux gate 600 is a portion of an entire integrated circuit.

Figure 9:
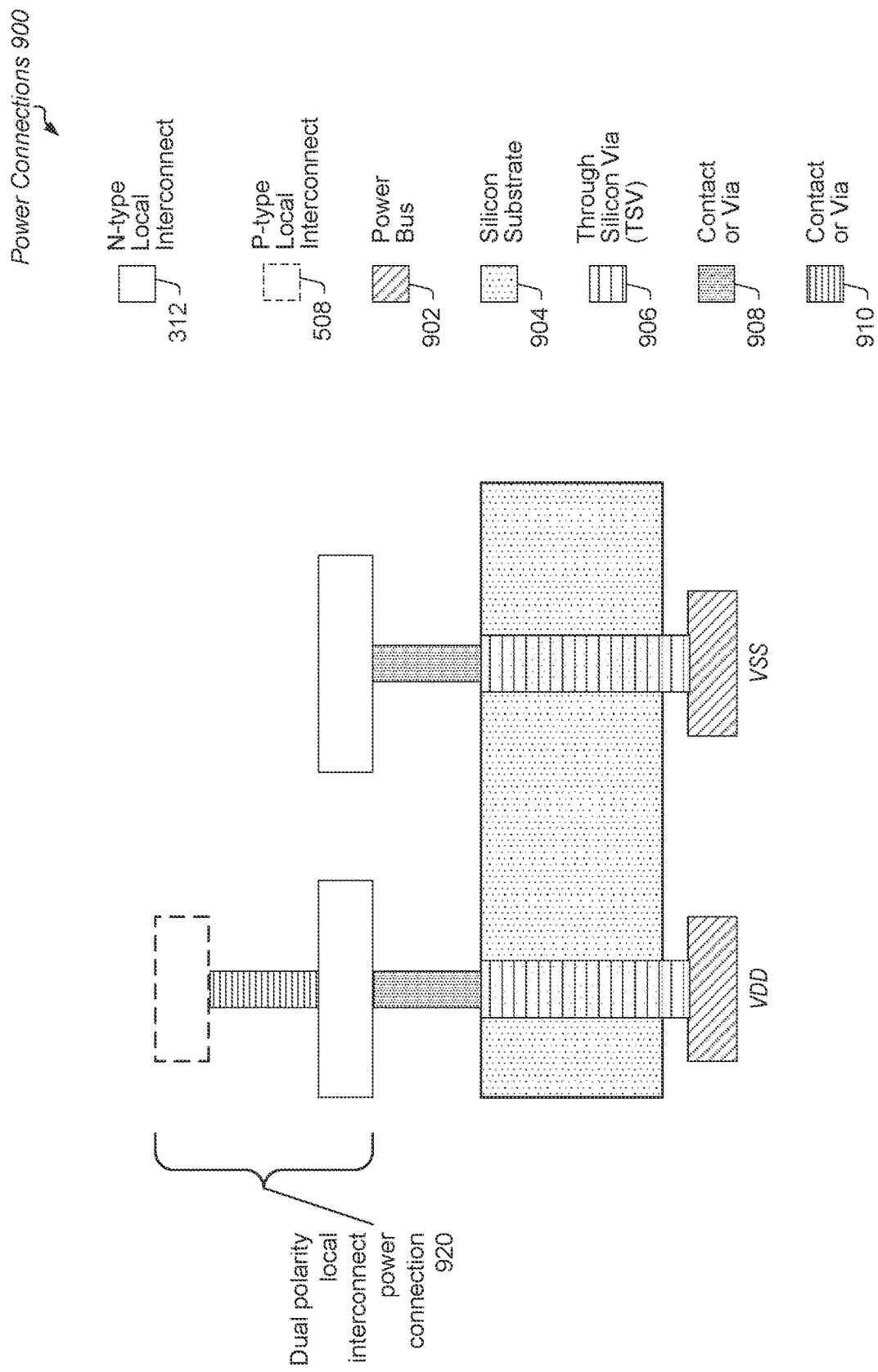
FIG. 9 is a generalized diagram of power connections of an integrated circuit using instantiated cells with Cross FETs.

Referring now to FIG. 9, one embodiment of power connections 900 is shown. Contacts (or vias), materials, structures and other layout elements described earlier are numbered identically. A power bus 902 below the silicon substrate 904 routes one or more power signals such as at least a power supply reference voltage level (VDD) and a ground reference voltage level (VSS). These signals of the power bus 902 are routed through the silicon substrate 904 with the use of through silicon vias (TSVs) 906. A contact (or via) 908 routes the power signal to a local interconnect layer. In one implementation, a p-type device is being vertically stacked on an n-type device. However, in other implementations, it is possible and contemplated to have an n-type device vertically stacked on a p-type device.

The contact 908 physically connects to the n-type local interconnect 312. Therefore, the ground reference voltage level (VSS) is routed to a source region of an n-type device. In some cases, the n-type local interconnect 312 is not used by an n-type device such as the n-type local interconnect 312 located on the left side of the diagram. This particular n-type local interconnect 312 is used to provide rigidity and strength to a power signal route between a power supply reference voltage level (VDD) originating from a TSV 906 and a p-type device located above n-type devices. The contact 910 physically connects to each of the n-type local interconnect 312 and a p-type local interconnect 508. The source region of a p-type device is able to receive the power supply reference voltage level (VDD).

Figure 10:
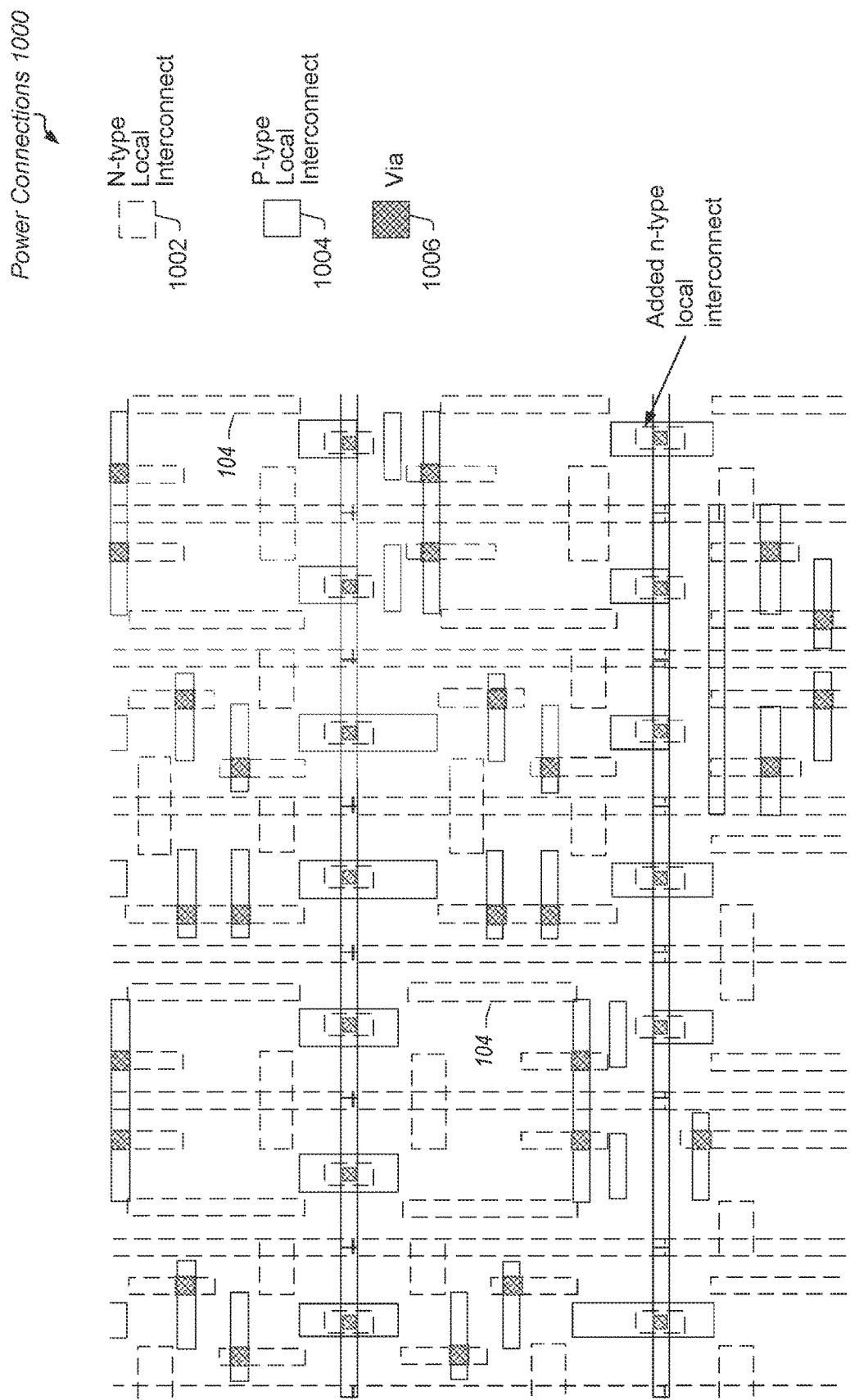
FIG. 10 is a generalized diagram of power connections of an integrated circuit using instantiated cells with Cross FETs.

Turning to FIG. 10, one embodiment of power connections 1000 for standard cells utilizing Cross FETs is shown. Here, the layout of a mux gate, such as the layout 700-800, replicated as the mux gate is repeatedly instantiated. For example, the layout of the mux gate is mirrored and flipped repeatedly. Although a mux gate is shown as a cell being repeatedly instantiated, it is contemplated that a variety of cells providing different functionalities can be instantiated in an integrated circuit and use the power connection techniques shown in the upcoming figures. The n-type local interconnect layer 1002 is used to route a ground reference voltage level to the source regions of n-type devices of the cells. The p-type local interconnect layer 1004 is used to route a power supply reference voltage level to the source regions of p-type devices of the cells.

As shown, additional n-type local interconnect is added, which is not used by an n-type device. These repeated additional instantiations of the n-type local interconnect 1002 are used to route the power supply reference voltage level to the source regions of p-type devices of the cells. The vias 1006 provide a connection from the p-type local interconnect layer 1004 to the n-type local interconnect layer 1002 and to a through silicon via in the silicon substrate. For example, the additional n-type local interconnect 1002 is used to create a dual polarity local interconnect power connection such as the connection 920 shown earlier in FIG. 9. Power rails routed in both the n-type local interconnect layer 1002 and the p-type local interconnect layer 1004 provide redundancy for the power connections and improve wafer yield.

In the power connections 1100 (of FIG. 11), the backside rails and vias of the ground reference voltage level (VSS) 1102 are shown being routed horizontally below the power rails routed in the p-type local interconnect layer 1004. Similarly, the backside rails and vias of the power supply voltage level (VDD) 1104 are shown being routed horizontally below the power rails routed in the n-type local interconnect layer 1004. In various implementations, the backside rails and vias 1102 of VSS are rails similar to the power bus 902 labeled VSS in FIG. 9. Similarly, the backside rails and vias 1104 of VDD are rails similar to the power bus 902 labeled VDD in FIG. 9. It is noted that power connections, such as connections 920 (of FIG. 9) are also directly above the backside rail 1104. In the power connections 1200 (of FIG. 12), the backside rails and vias 1102 and 1104 are shown being routed vertically below the power rails routed in the p-type and n-type local interconnect layers 1002 and 1004.

In the power connections 1300 (of FIG. 13), the power rails using the p-type local interconnect layer 1004 are removed, or otherwise, not used. Therefore, the added power connections using the n-type local interconnect layer 1002, such as power connection 920, no longer have redundancy. Similarly, the p-type devices no longer have redundancy with power connections. Such a design choice is used when wafer yield is expected to be high. One of the horizontal and vertical routing of the backside power buses can be used with this configuration. For example, the backside routing shown in FIGS. 11-12 can be used.

Figure 11:
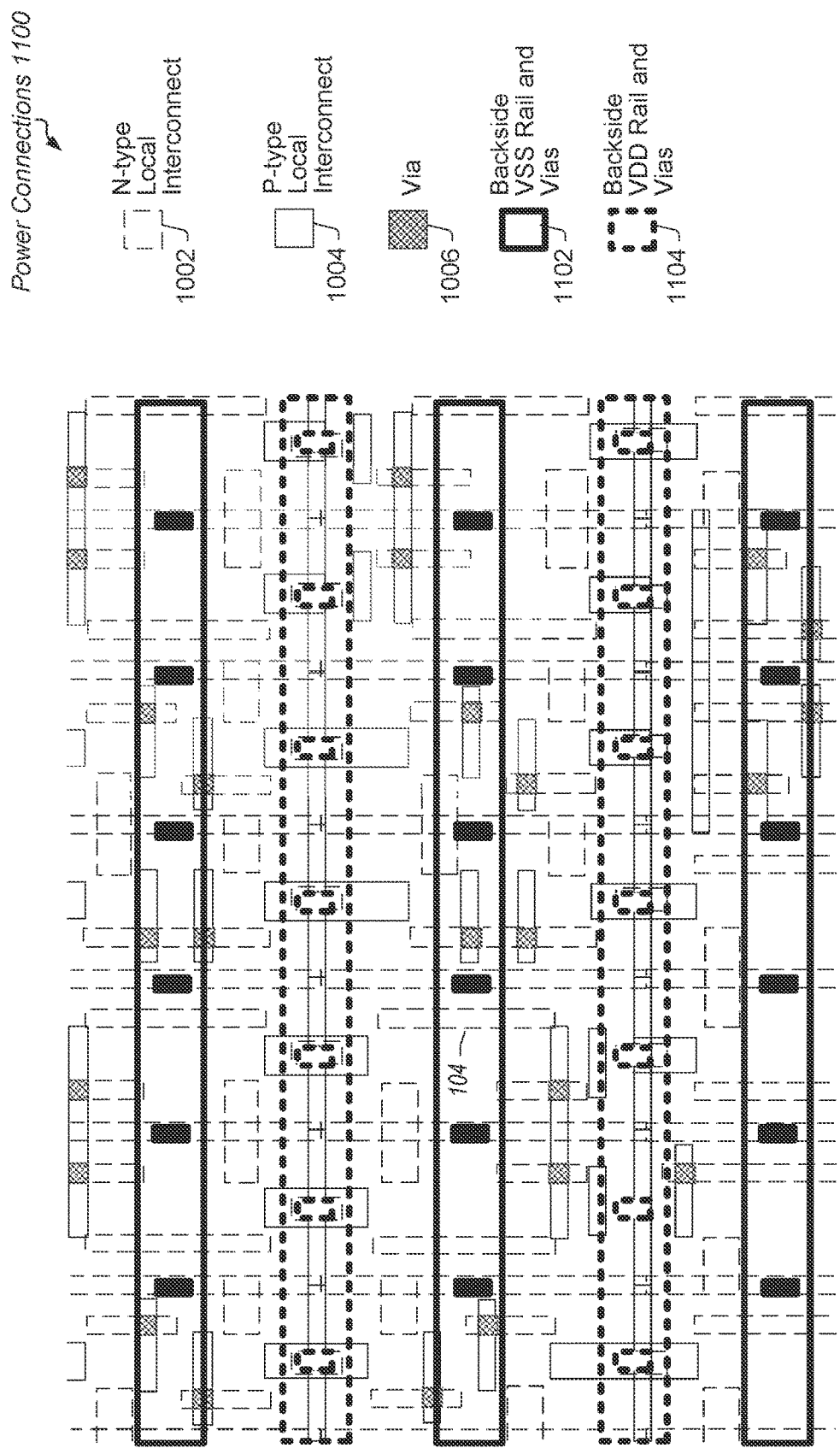
FIG. 11 is a generalized diagram of power connections of an integrated circuit using instantiated cells with Cross FETs.
Figure 12:
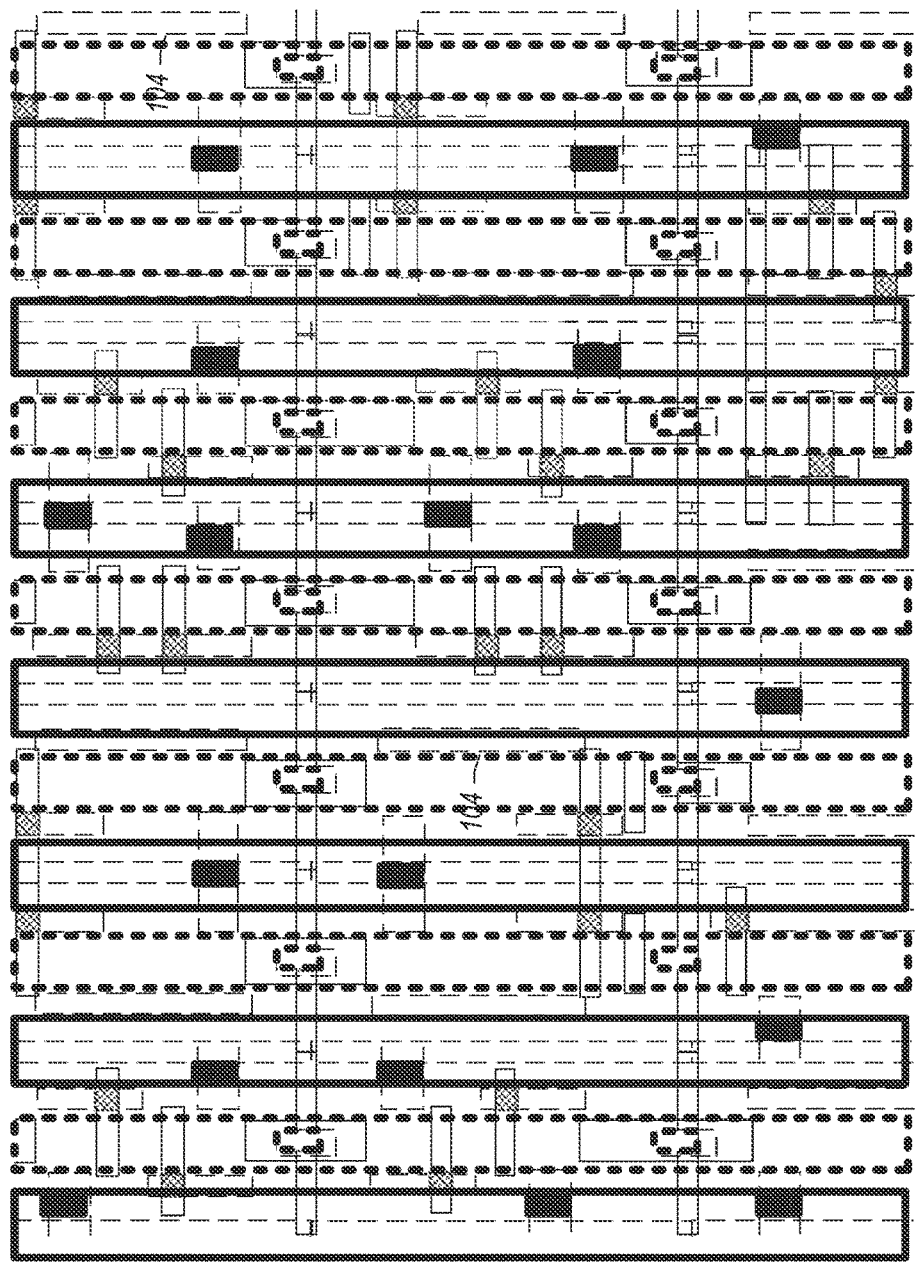
FIG. 12 is a generalized diagram of power connections of an integrated circuit using instantiated cells with Cross FETs.
Figure 13:
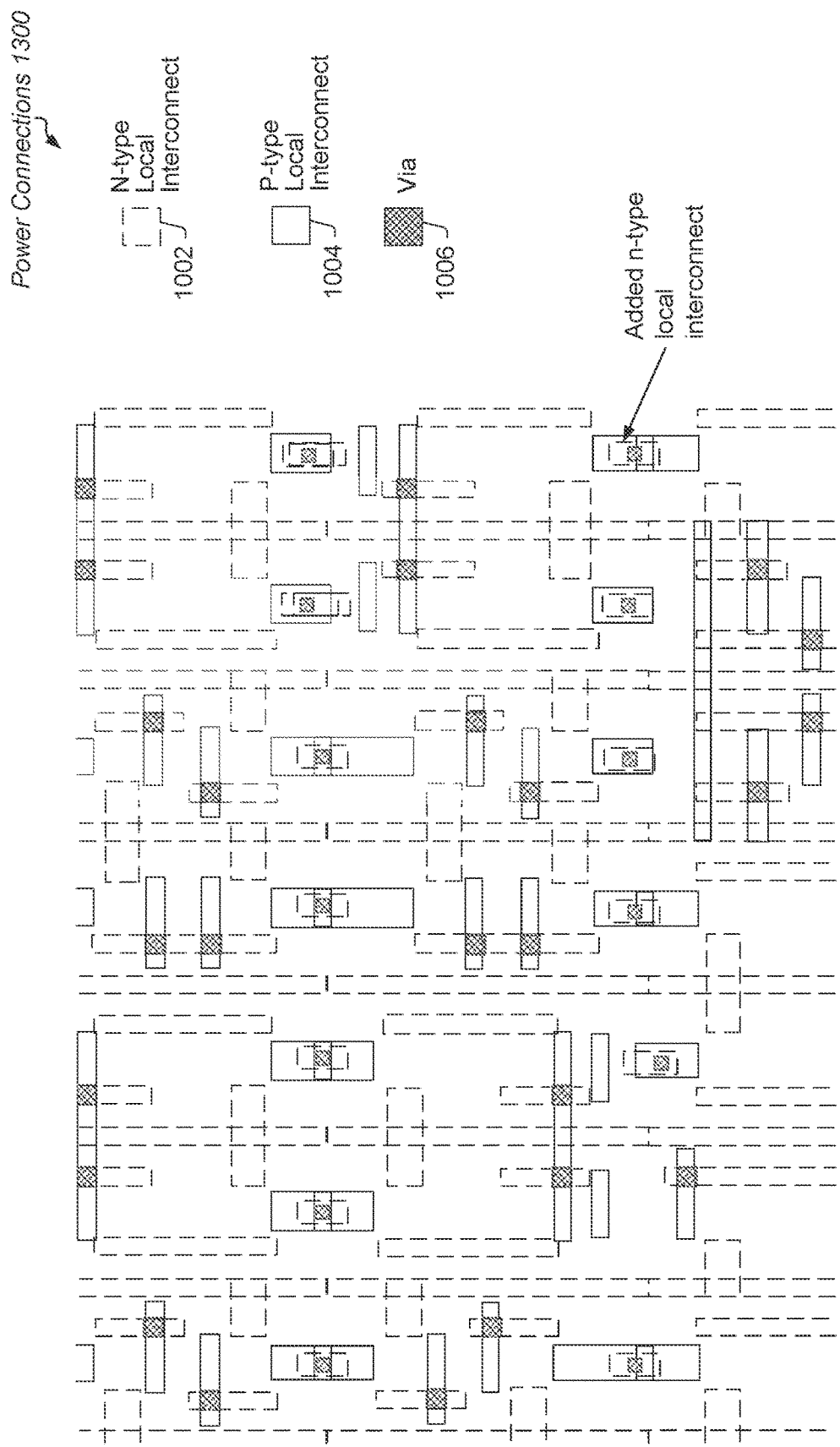
FIG. 13 is a generalized diagram of power connections of an integrated circuit using instantiated cells with Cross FETs.
Figure 14:
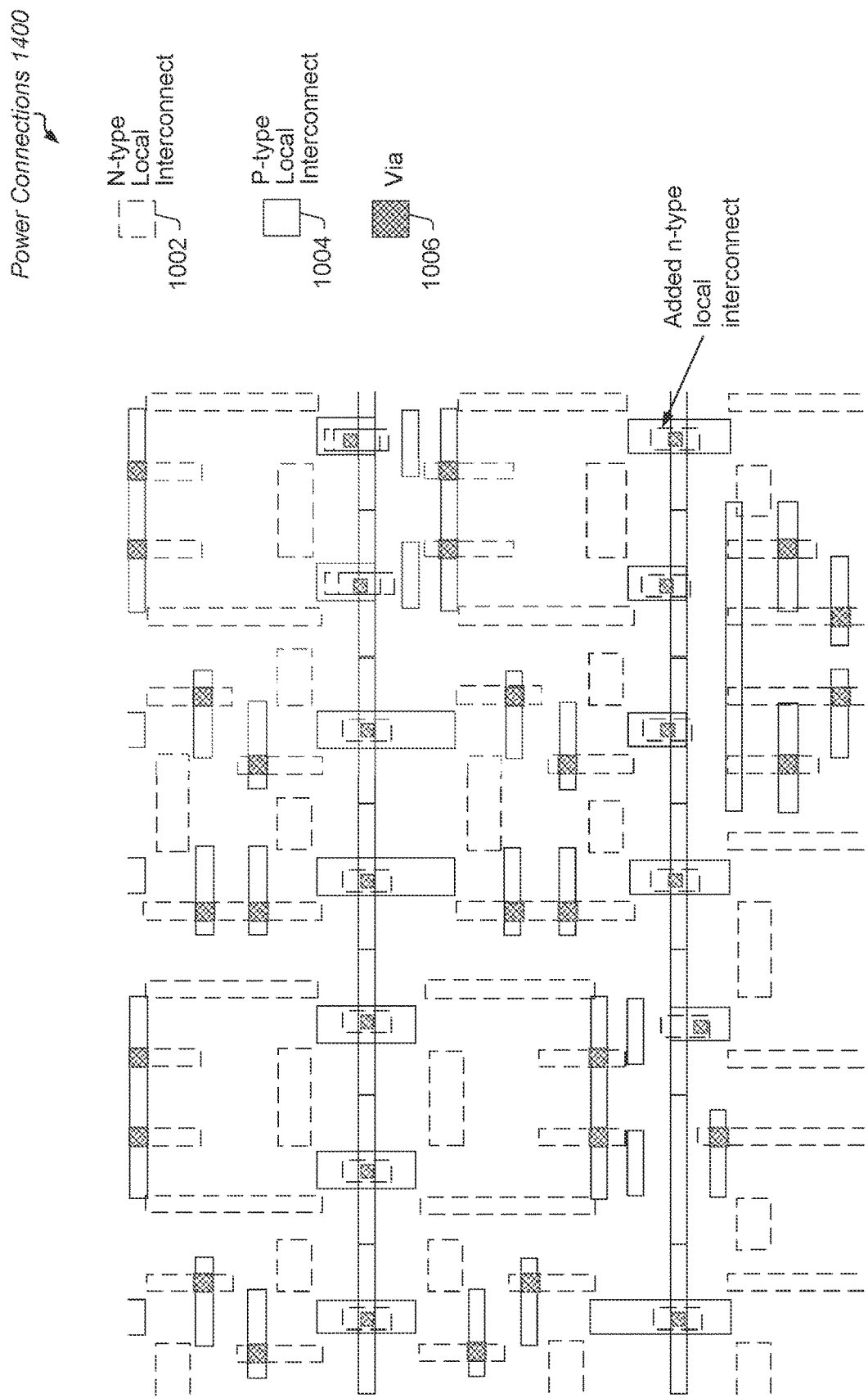
FIG. 14 is a generalized diagram of power connections of an integrated circuit using instantiated cells with Cross FETs.
Figure 15:
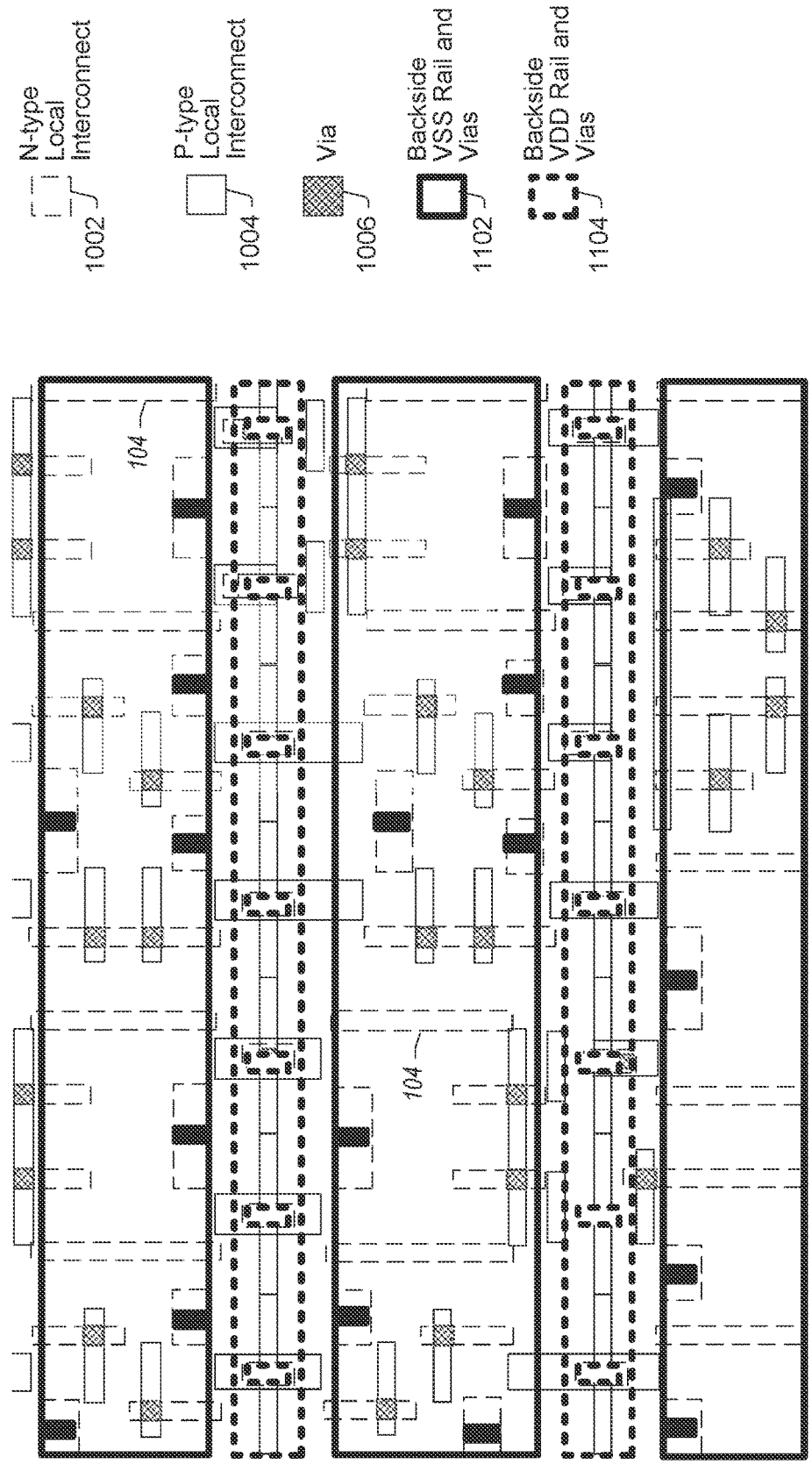
FIG. 15 is a generalized diagram of power connections of an integrated circuit using instantiated cells with Cross FETs.

In the power connections 1400 (of FIG. 14), the power rails using the n-type local interconnect layer 1004 are removed, or otherwise, not used. Therefore, the n-type devices no longer have redundancy with power connections. Such a design choice is used when wafer yield is expected to be high. One of the horizontal and vertical routing of the backside power buses as shown in FIGS. 11-12 can be used with this configuration. In the power connections 1500 (of FIG. 15), the power rails using the n-type local interconnect layer 1024 are removed, or otherwise, not used. Additionally, the backside rails and vias of the ground reference voltage level (VSS) 1102 are shown being routed horizontally below the power rails routed in the p-type local interconnect layer 1004. Similarly, the backside rails and vias of the power supply voltage level (VDD) 1104 are shown being routed horizontally below the power rails routed in the n-type local interconnect layer 1004.

Figure 16:
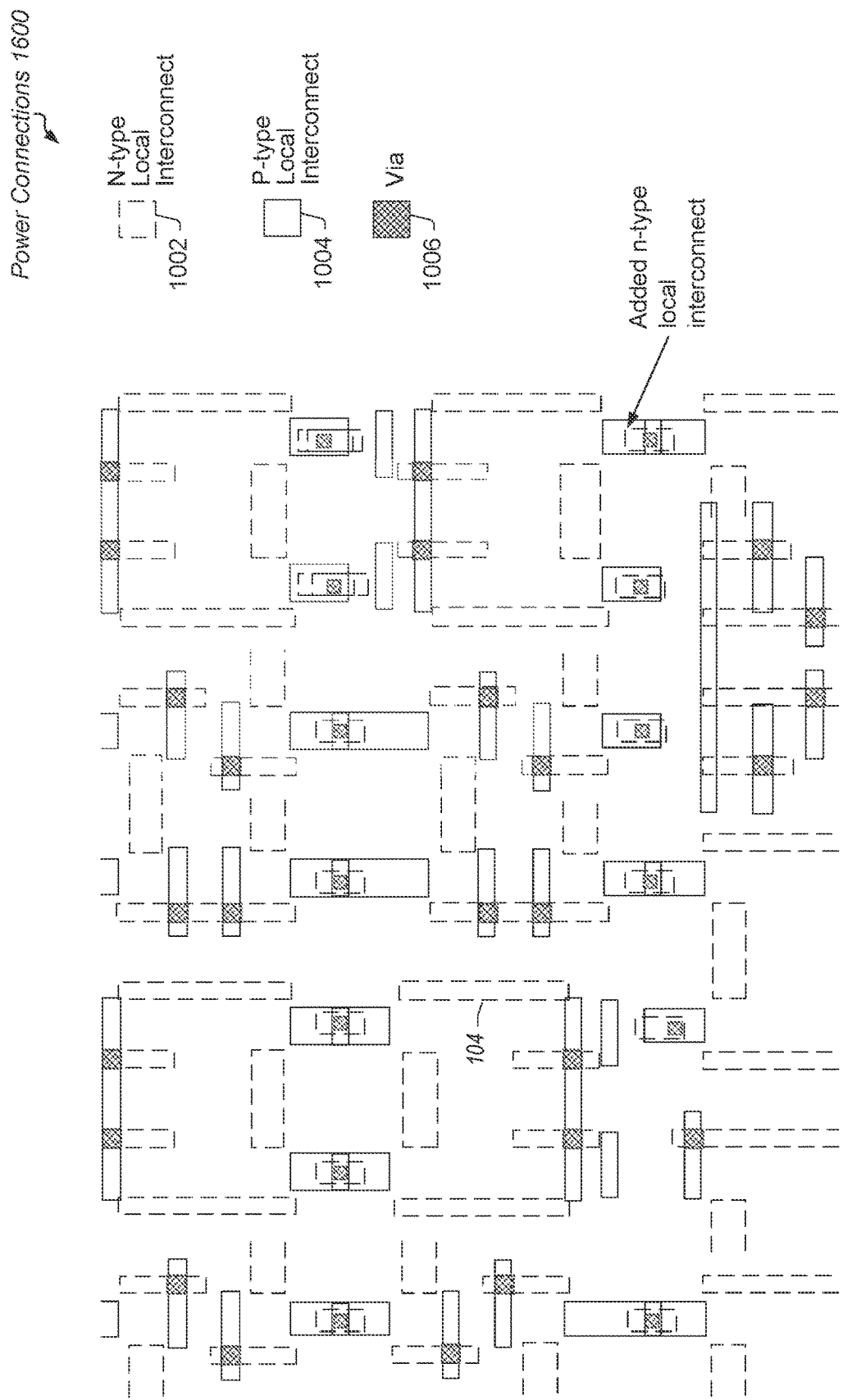
FIG. 16 is a generalized diagram of power connections of an integrated circuit using instantiated cells with Cross FETs.
Figure 17:
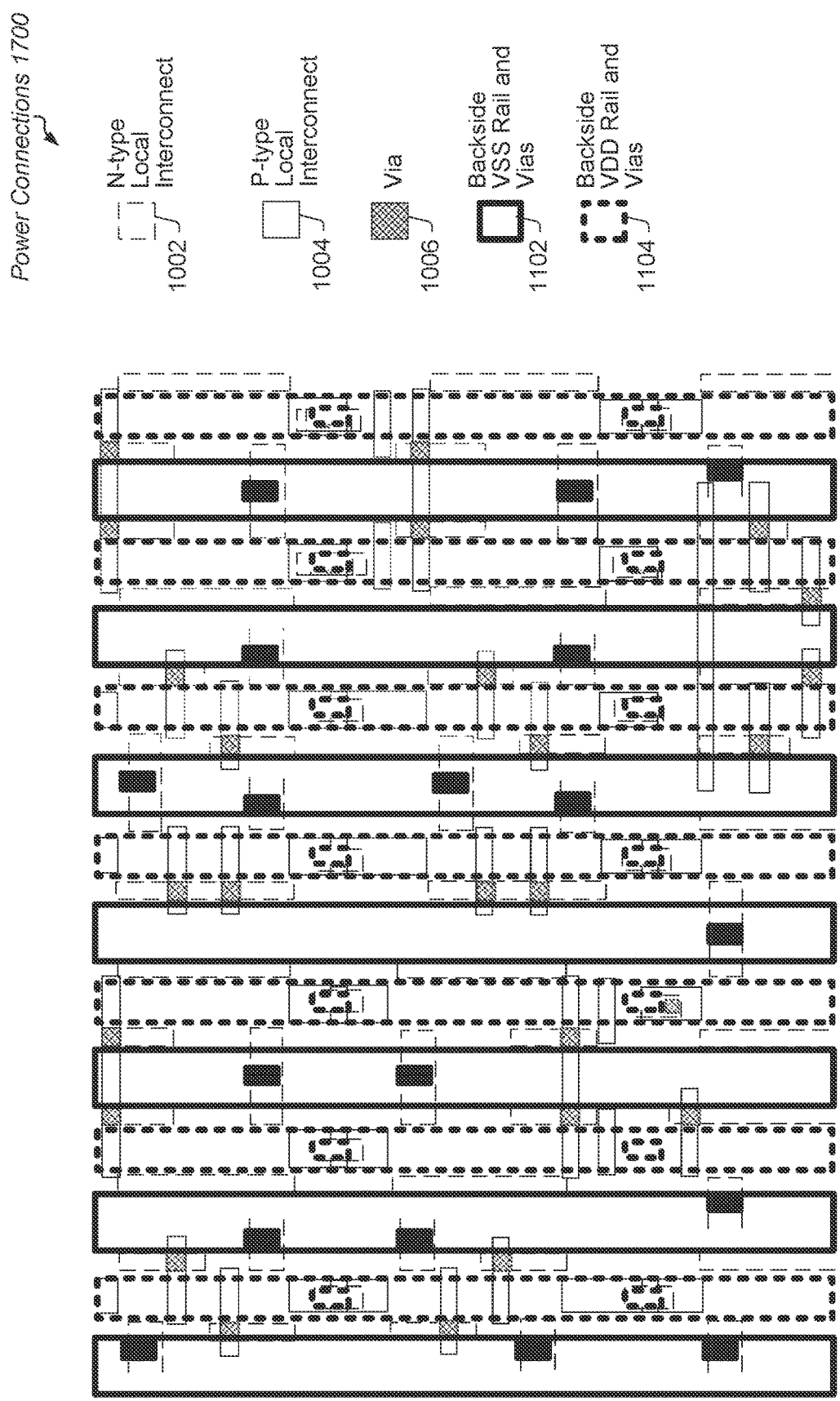
FIG. 17 is a generalized diagram of power connections of an integrated circuit using instantiated cells with Cross FETs.

In the power connections 1600 (of FIG. 16), the power rails using the n-type local interconnect layer 1002 are removed, or otherwise, not used. Therefore, the n-type devices no longer have redundancy with power connections. Additionally, the power rails using the p-type local interconnect layer 1004 are removed, or otherwise, not used. Therefore, the added power connections using the n-type local interconnect layer 1002, such as power connection 920, no longer have redundancy. Similarly, the p-type devices no longer have redundancy with power connections. Such a design choice is used when wafer yield is expected to be high. In the power connections 1700 (of FIG. 17), both the power rails using the n-type local interconnect layer 1002 and the power rails using the p-type local interconnect layer 1004 are removed, or otherwise, not used. The backside rails and vias 1102 and 1104 are shown being routed vertically.

Figure 18:
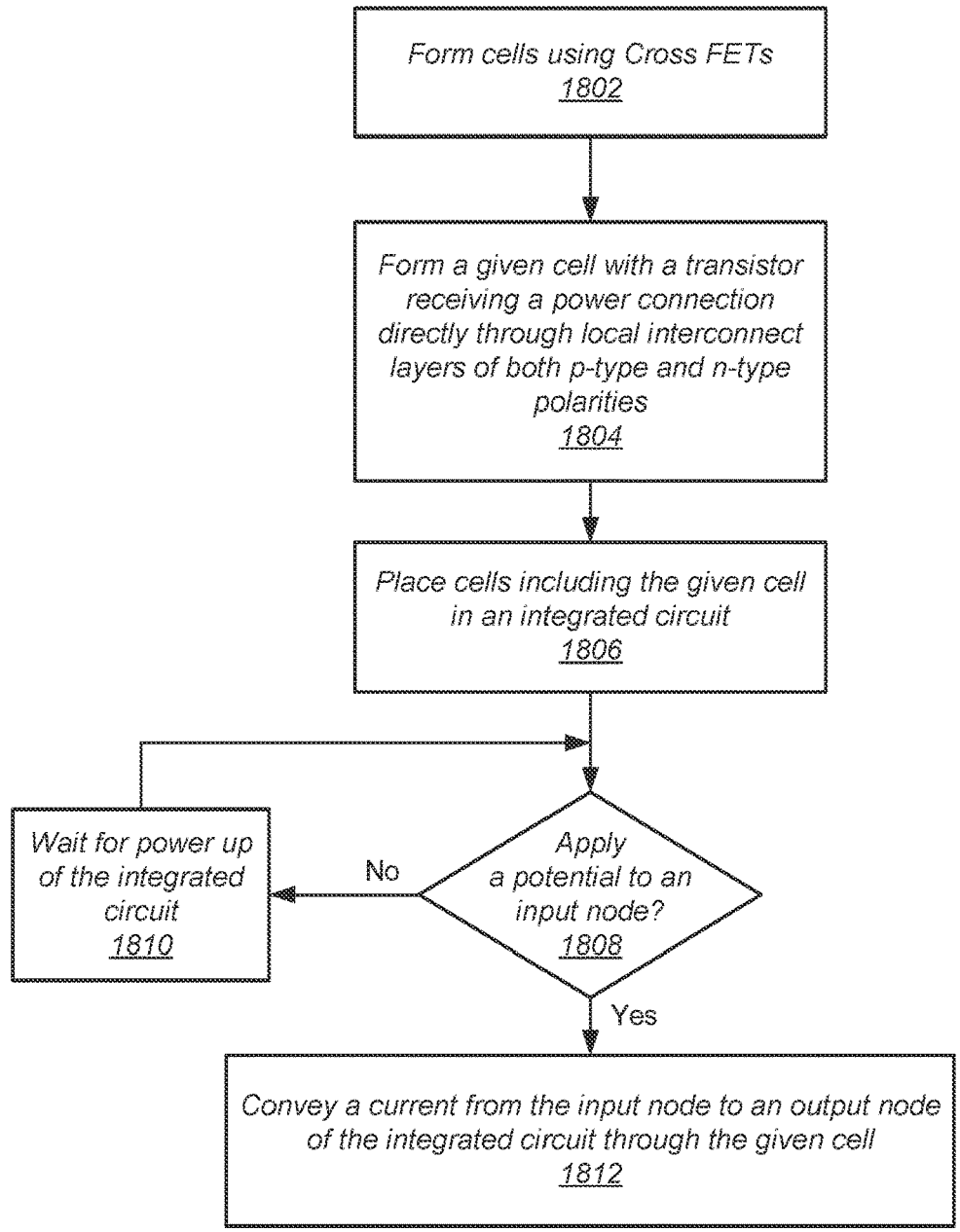
FIG. 18 is a generalized diagram of one embodiment of a method for efficiently creating power connections for standard cells that utilize Cross FETs.

Referring now to FIG. 18, one embodiment of a method 1800 for efficiently creating layout for standard cells that utilize Cross FETs is shown. For purposes of discussion, the steps in this embodiment are shown in sequential order. However, in other embodiments some steps occur in a different order than shown, some steps are performed concurrently, some steps are combined with other steps, and some steps are absent.

A semiconductor fabrication process forms cells using Cross FETs (block 1802). The semiconductor fabrication process (or process) forms a given cell with a transistor receiving a power connection directly through local interconnect layers of both p-type and n-type polarities (block 1804). The process places cells including the given cell in an integrated circuit (block 1806). If a potential is not applied to an input node of the integrated circuit ("no" branch of the conditional block 1808), then the integrated circuit waits for power up (block 1810). However, if a potential is applied to the input node of the integrated circuit ("yes" branch of the conditional block 1810), then the integrated circuit conveys a current from the input node to an output node through the given cell (block 1812).

Figure 19:
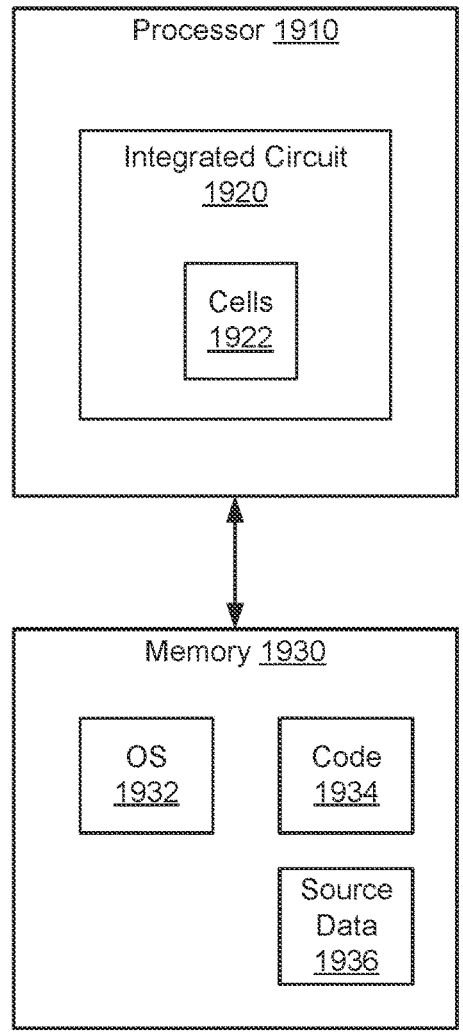
FIG. 19 is a generalized diagram of computing system with an integrated circuit that uses standard cells that utilize Cross FETs.

Referring to FIG. 19, one embodiment of a computing system 1900 is shown. The computing system 1900 includes the processor 1910 and the memory 1930. Interfaces, such as a memory controller, a bus or a communication fabric, one or more phased locked loops (PLLs) and other clock generation circuitry, a power management unit, and so forth, are not shown for ease of illustration. It is understood that in other implementations, the computing system 1900 includes one or more of other processors of a same type or a different type than processor 1910, one or more peripheral devices, a network interface, one or more other memory devices, and so forth. In some implementations, the functionality of the computing system 1900 is incorporated on a system on chip (SoC). In other implementations, the functionality of the computing system 1900 is incorporated on a peripheral card inserted in a motherboard. The computing system 1900 is used in any of a variety of computing devices such as a desktop computer, a tablet computer, a laptop, a smartphone, a smartwatch, a gaming console, a personal assistant device, and so forth.

The processor 1910 includes hardware such as circuitry. For example, the processor 1910 includes at least one integrated circuit 1920, which utilizes Cross FETs for implementing standard cells. For example, the integrated circuit includes cells 1922 where one or more of these cells 1922 uses dual polarity local interconnect power connection as shown earlier with connection 920 (of FIG. 9). In various implementations, the processor 1910 includes one or more processing units. In some implementations, each of the processing units includes one or more processor cores capable of general-purpose data processing, and an associated cache memory subsystem. In such an implementation, the processor 1910 is a central processing unit (CPU). In another implementation, the processing cores are compute units, each with a highly parallel data microarchitecture with multiple parallel execution lanes and an associated data storage buffer. In such an implementation, the processor 1910 is a graphics processing unit (GPU), a digital signal processor (DSP), or other.

In some implementations, the memory 1930 includes one or more of a hard disk drive, a solid-state disk, other types of flash memory, a portable solid-state drive, a tape drive and so on. The memory 1930 stores an operating system (OS) 1932, one or more applications represented by code 1934, and at least source data 1936. Memory 1930 is also capable of storing intermediate result data and final result data generated by the processor 1910 when executing a particular application of code 1934. Although a single operating system 1932 and a single instance of code 1934 and source data 1936 are shown, in other implementations, another number of these software components are stored in memory 1930. The operating system 1932 includes instructions for initiating the boot up of the processor 1910, assigning tasks to hardware circuitry, managing resources of the computing system 1900 and hosting one or more virtual environments.

Each of the processor 1910 and the memory 1930 includes an interface unit for communicating with one another as well as any other hardware components included in the computing system 1900. The interface units include queues for servicing memory requests and memory responses, and control circuitry for communicating with one another based on particular communication protocols. The communication protocols determine a variety of parameters such as supply voltage levels, power-performance states that determine an operating supply voltage and an operating clock frequency, a data rate, one or more burst modes, and so on.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer.

For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
   a first transistor comprising a first channel oriented in a first direction;
   an oxide layer vertically adjacent to the first transistor;
   a first local interconnect layer vertically adjacent to the oxide layer; and
   a first via physically connecting the first local interconnect layer to a source region of the first transistor; and
   wherein responsive to a potential being applied to an input node of a cell of the integrated circuit, a current is conveyed from the input node to an output node of the cell through the first transistor.

2. The integrated circuit as recited in claim 1, wherein the integrated circuit further comprises a second transistor horizontally adjacent to the first local interconnect layer, wherein the second transistor comprises a second channel that is oriented in a direction orthogonal to the first direction.

3. The integrated circuit as recited in claim 2, wherein a first doping polarity of the first channel is an opposite polarity of a second doping polarity of the second channel.

4. The integrated circuit as recited in claim 2, wherein the first local interconnect layer provides to the source region of the first transistor one of a power supply voltage reference level and a ground reference voltage level used by the integrated circuit.

5. The integrated circuit as recited in claim 4, wherein the integrated circuit further comprises:
   a rail vertically adjacent to a backside of a silicon substrate; and
   a second via through the silicon substrate, wherein the second via physically connects the first local interconnect layer to the rail.

6. The integrated circuit as recited in claim 4, wherein the integrated circuit further comprises a second local interconnect layer physically connecting the source region of the first transistor to the first via.

7. The integrated circuit as recited in claim 6, further comprising a third transistor horizontally adjacent to the first transistor, wherein the second local interconnect layer physically connects a source region of the first transistor to a source region of the third transistor.

* * * * *